(12) United States Patent
Niemi

(10) Patent No.: US 12,397,253 B1
(45) Date of Patent: Aug. 26, 2025

(54) COMPUTER FARM VENTILATION SYSTEM

(71) Applicant: S-M Enterprises, Inc., Moorhead, MN (US)

(72) Inventor: Dale W. Niemi, Moorhead, MN (US)

(73) Assignee: S-M Enterprises, Inc., Moorhead, MN (US)

( * ) Notice: Subject to any disclaimer, the term of this patent is extended or adjusted under 35 U.S.C. 154(b) by 395 days.

(21) Appl. No.: 18/146,636

(22) Filed: Dec. 27, 2022

(51) Int. Cl.
| | | |
|---|---|---|
| *B01D 46/00* | (2022.01) | |
| *B01D 46/12* | (2022.01) | |
| *B01D 46/58* | (2022.01) | |
| *H05K 7/20* | (2006.01) | |
| *F24F 13/28* | (2006.01) | |

(52) U.S. Cl.
CPC ......... *B01D 46/0005* (2013.01); *B01D 46/12* (2013.01); *B01D 46/58* (2022.01); *H05K 7/20745* (2013.01); *B01D 2267/60* (2013.01); *B01D 2267/70* (2013.01); *B01D 2279/35* (2013.01); *F24F 13/28* (2013.01)

(58) Field of Classification Search
CPC .... B01D 46/0005; B01D 46/12; B01D 46/58; B01D 2267/60; B01D 2267/70; B01D 2279/35; H05K 7/20745; F24F 13/28
USPC .......................................................... 55/483
See application file for complete search history.

(56) References Cited

U.S. PATENT DOCUMENTS

| | | | | |
|---|---|---|---|---|
| 1,747,364 A | * | 2/1930 | Greene ................. | B01D 46/12 55/483 |
| 3,552,704 A | * | 1/1971 | Pond ...................... | F24F 13/28 248/342 |
| 4,233,044 A | * | 11/1980 | Allan .................... | B01D 46/522 55/483 |
| 5,797,975 A | * | 8/1998 | Davis .................... | B01D 46/12 55/491 |
| 6,387,164 B1 | * | 5/2002 | Cheng ................... | F24F 8/192 55/483 |
| 9,668,375 B2 | | 5/2017 | Totani | |
| 2005/0268584 A1 | * | 12/2005 | Bruggendick ..... | B01D 39/2068 55/483 |
| 2011/0009047 A1 | | 1/2011 | Noteboom | |
| 2011/0105015 A1 | | 5/2011 | Carlson | |
| 2014/0259966 A1 | | 9/2014 | Totani | |
| 2017/0363318 A1 | * | 12/2017 | White ................... | B01D 46/12 |
| 2018/0345193 A1 | * | 12/2018 | Graves ............... | B01D 46/0097 |
| 2019/0022568 A1 | * | 1/2019 | Chernansky ........ | H02B 13/025 |
| 2020/0101408 A1 | * | 4/2020 | Brown ................. | F24F 1/0073 |

(Continued)

OTHER PUBLICATIONS https://journal.uptimeinstitute.com/data-center-free-air-cooling-trends/ #:~:text=Direct%20air%3A%20Outside%20air%20passes,inlet% 20temperature%20for%20the%20facility; UptimeInstitute Webpage Article "Data Center Free Air Cooling Trends"; Rabih Bashroush; Sep. 9, 2019.

(Continued)

*Primary Examiner* — T. Bennett McKenzie
(74) *Attorney, Agent, or Firm* — Neustel Law Offices

(57) ABSTRACT

A server farm ventilation assembly adapted to separate an interior of a building from an exterior while allowing air to pass from the exterior to the interior, comprising of a frame defining an air filter opening, and an air filter subassembly comprising a plurality of air filters. A plurality of removable vertical brackets and horizontal brackets are used to retain the plurality of air filters within the frame thereby allowing filtered air to pass through the air filter opening.

11 Claims, 11 Drawing Sheets

(56) References Cited

U.S. PATENT DOCUMENTS

2022/0056757 A1\* 2/2022 Lim ........................ F24F 8/108
2023/0294027 A1\* 9/2023 Jadhav ................... B01D 46/10

OTHER PUBLICATIONS https://www.datacenterknowledge.com/inside-microsofts-dublin-mega-data-center/dublin-data-center-free-cooling-diagram; DataCenter Knowledge Article "Dublin Data Center: Free Cooling Diagram"; Sep. 28, 2009.
https://www.acr-news.com/stulz-dfc---direct-free-cooling-for-data-centres-; ACR News; Stulz DFC2 Direct Free Cooling for Data Centres; Jan. 31, 2011.
https://www.systemair.com/ie/applications/data-centre/indirect-free-cooling-units-for-data-centres/; Systemair "Indirect Free Cooling Units for Data Centres" Webpage; Printed Nov. 18, 2022.
https://www.akcp.com/articles/best-data-center-cooling-practices-to-implement/; AKCP "Best Data Center Cooling Practices to Implement"; Clarissa Garcia; Jun. 2021.

\* cited by examiner

COMPUTER FARM VENTILATION SYSTEM

CROSS REFERENCE TO RELATED APPLICATIONS

Not applicable to this application.

STATEMENT REGARDING FEDERALLY SPONSORED RESEARCH OR DEVELOPMENT

Not applicable to this application.

BACKGROUND

The described example embodiments in general relate to a ventilation system for a computer farm for efficiently cooling a computer farm with filtered exterior ambient air.

Computer farms (e.g. computer server farms) are a collection of computer servers, usually maintained by an organization to supply server functions far beyond the capability of a single machine. Server farms often consist of thousands of computers which require a large amount of power to run and to keep cool. The performance of the largest server farms (thousands of processors and up) is typically limited by the performance of the data center's cooling systems and the total electricity cost rather than by the processors' performance.

Computers in server farms run 24/7 and consume large amounts of electricity. For this reason, the critical design parameter for both large and continuous systems is often performance per watt rather than cost of peak performance or (peak performance/(unit*initial cost)). Also, for high availability systems that must run 24/7 (unlike supercomputers that can be power-cycled to demand, and also tend to run at much higher levels), there is more attention to power-saving features. External air is often used as a cooling agent. This is particularly the case where the server farm is located in a relatively low temperature region. External air needs to be filtered, and the air filters need to be regularly replaced. Thus, there is a need for an expeditious way to install air filters, remove the dirty or damaged air filters, and replace such dirty or damaged air filters.

SUMMARY

Some of the various embodiments of the present disclosure relate to an exterior air filtration and ventilation system that can filter exterior ambient air prior to being used to thermally manage a computer farm on the interior of a building. Some of the various embodiments of the present disclosure include a server farm ventilation assembly adapted to separate an interior of a building from an exterior while allowing air to pass from the exterior to the interior, comprising of a frame having a first side wall, a second side wall, a bottom wall and a top wall, with the walls cooperating to define an air filter opening, and an air filter subassembly comprising at least a pair of air filters, with each air filter having a width, wherein the air filters cooperate to close the air filter opening. A vertical bracket has a show surface facing the interior and a flange extending away from the show surface of the vertical bracket and toward the exterior, the vertical bracket further comprising a projection at one end, and a horizontal bracket extending from the first side wall to the second side wall, having a show surface and a flange extending away from the show surface of the horizontal bracket and toward the exterior, and defining an opening. The flange of the vertical bracket is positioned in a gap between adjacent air filters, and the opening of the horizontal bracket is adapted to receive the projection of the vertical bracket.

There has thus been outlined, rather broadly, some of the embodiments of the present disclosure in order that the detailed description thereof may be better understood, and in order that the present contribution to the art may be better appreciated. There are additional embodiments that will be described hereinafter and that will form the subject matter of the claims appended hereto. In this respect, before explaining at least one embodiment in detail, it is to be understood that the various embodiments are not limited in its application to the details of construction or to the arrangements of the components set forth in the following description or illustrated in the drawings. Also, it is to be understood that the phraseology and terminology employed herein are for the purpose of the description and should not be regarded as limiting.

To better understand the nature and advantages of the present disclosure, reference should be made to the following description and the accompanying figures. It is to be understood, however, that each of the figures is provided for the purpose of illustration only and is not intended as a definition of the limits of the scope of the present disclosure. Also, as a general rule, and unless it is evidence to the contrary from the description, where elements in different figures use identical reference numbers, the elements are generally either identical or at least similar in function or purpose.

DETAILED DESCRIPTION

Figure 1:
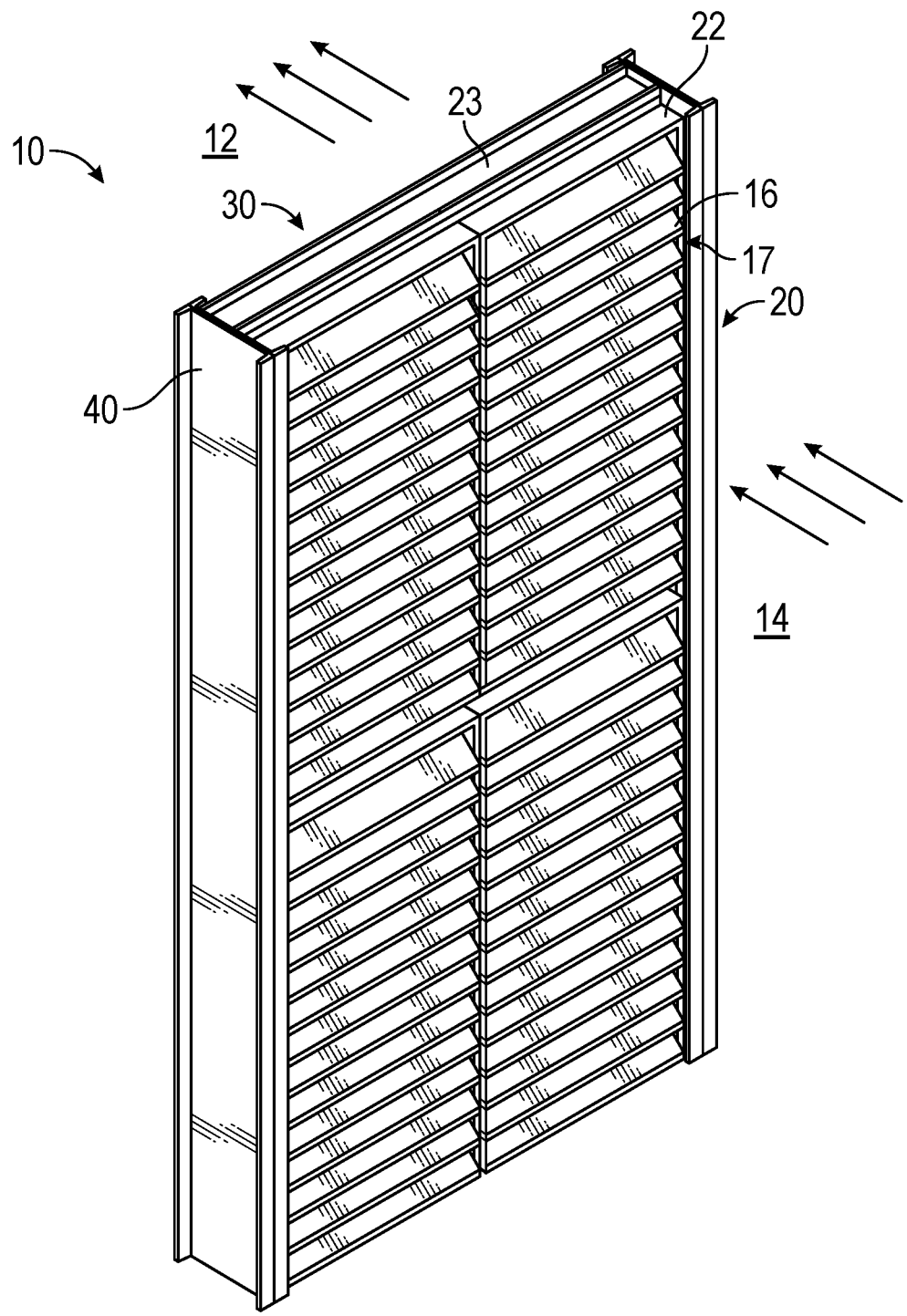
FIG. 1 is an isometric view of an exterior side of a server farm ventilation assembly in accordance with one embodiment.

Turning now to the drawings, FIG. 1 shows a server farm ventilation assembly 10 in accordance with one embodiment, shown from an exterior side 14. Exterior air flows from the exterior to the interior 12 in the direction shown by the arrows, through a louver subassembly 20 and then to an air filter subassembly 30. The server farm ventilation assembly separates the interior of a building from the exterior while allowing air to pass from the exterior to the interior. Typically, the louver subassembly 20 is positioned exteriorly of the air filter subassembly 30. The louver subassembly comprises a series of downward angled louvers 16 separated by louver gaps 17. The louvers 16 block most rain and snow and allow for passage of air to the air filter subassembly. A louver frame 22 may be formed as either part of the louver subassembly or the frame, and a top wall 23 may be formed as part of the frame as well.

Figure 2:
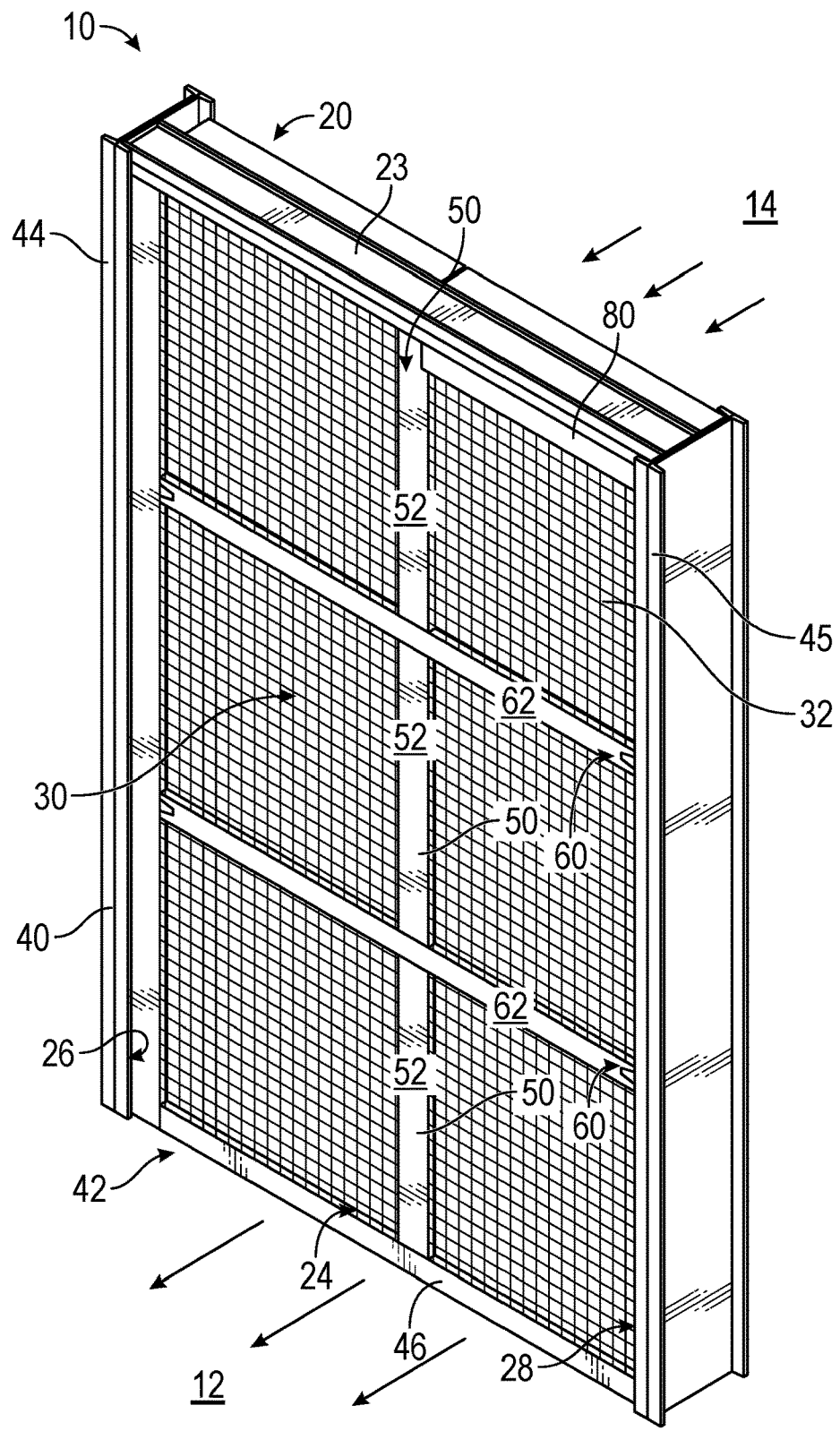
FIG. 2 is an isometric view of an interior side of the server farm ventilation assembly of the embodiment of FIG. 1.

FIG. 2 is a view of the server farm ventilation assembly from the interior 12, showing the air filter subassembly 30 formed as a series of rows of air filters 32 adapted to cooperate with the frame to close an opening 42 in a building or related structure. Typically, the air filters are smaller than the air filter opening to be closed, so at least two air filters are positioned in a row, and multiple rows of air filters are used. Vertical brackets 50 cooperate with horizontal brackets 60 to releasably secure the air filters 32 to the frame 40. The frame 40 can have a top wall 23, a first side wall 44, a second side wall 45, and a bottom wall 46. The walls form channels adapted to receive portions of some of the air filters 32. That is, each side wall 44, 45 defines a respective side channel 26, 28, the bottom wall 46 defines a bottom channel 24, and the top wall 23 defines a top channel 48, and all of the channels are adapted to receive part of one or more air filters. The louver subassembly frame 22 and air filter subassembly frame may be part of the frame 40 or formed as additional pieces affixed to the frame, as needed.

FIG. 2 also shows a series of vertical brackets 50 and a series of horizontal brackets 60. These brackets advantageously allow for ease of insertion and removal of air filters. In the embodiment of FIG. 2, three rows of air filters 32 use a pair of horizontal brackets and a three vertical brackets. Typically, the horizontal brackets 60 extend from the first side wall to the second side wall, and are attached to the side walls. Other configurations of rows of air filters, horizontal brackets and vertical brackets will be readily apparent to those skilled in the art, given the benefit of this disclosure. The vertical brackets 50 have a show surface 52 facing towards the interior 12, and the horizontal brackets 60 also have a show surface 62 facing towards the interior 12. Optionally the vertical bracket and horizontal bracket May be positioned flush with one another. That is, the show surfaces of the brackets generally lie in the same plane. Also shown on FIG. 2 is a top bracket 80. The top bracket 80 is adapted to be mounted to the top wall 23 of the frame and close a top opening, as discussed in greater detail below.

Figure 3:
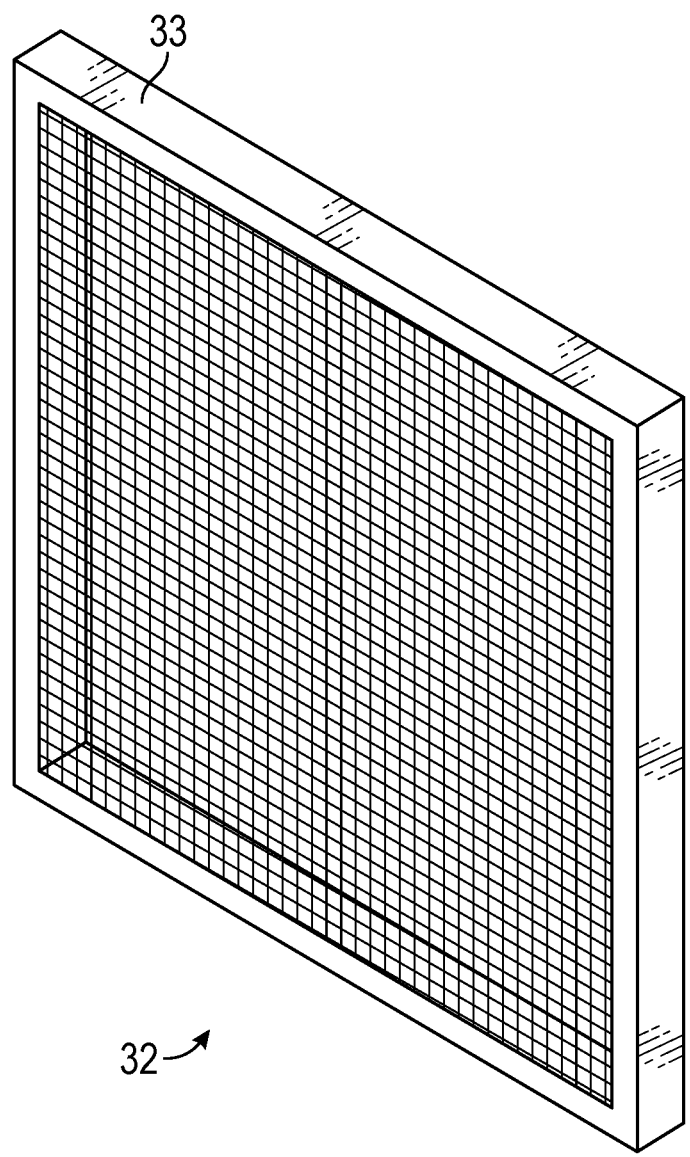
FIG. 3 is an isolated isometric view of an air filter in accordance with one embodiment.

FIG. 3 shows an isometric view of a representative air filter 32. The air filter can have a mesh interior of various materials, surrounded by an air filter frame 33. When assembled, the air filter frame can extend into one of the channels formed by the walls of the frame. The air filter also has a width, and in the embodiment shown in the drawings, about two air filters closed the opening formed in the frame. For larger frames more air filters May be used, and preferably there is an integer relationship between the number of air filters and a width of the opening formed in the frame.

Figure 4A:
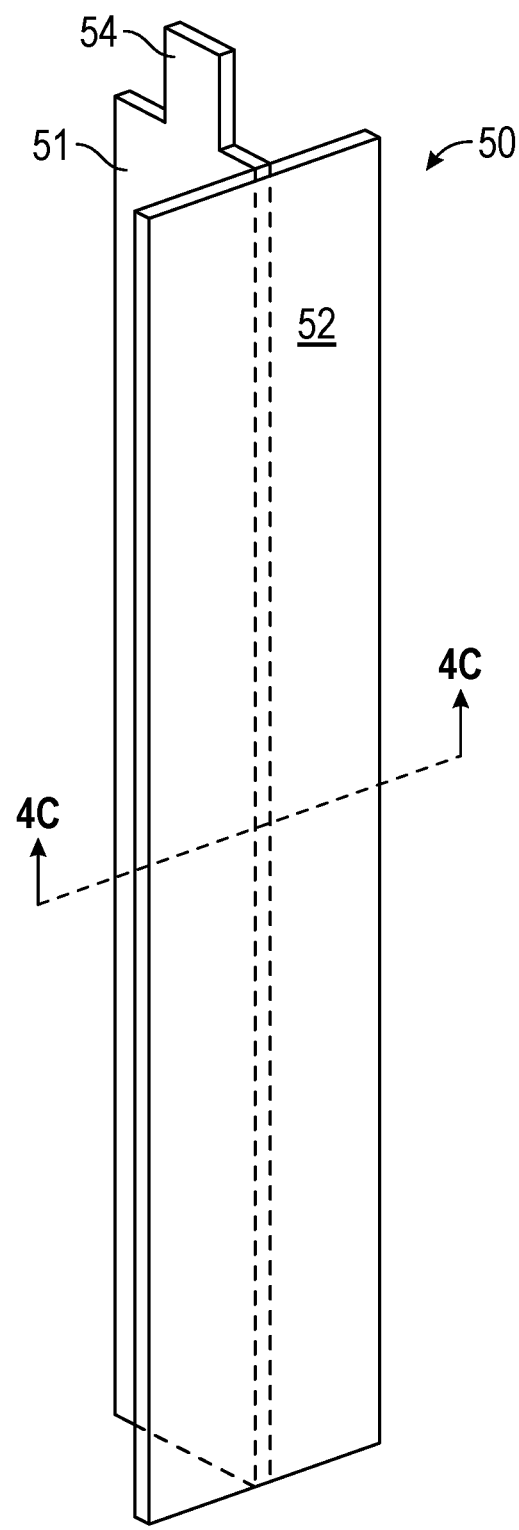
FIG. 4A is an isolated isometric view of a vertical bracket used to secure the air filters to a frame in accordance with one embodiment, showing a show surface.
Figures 4B, 4C:
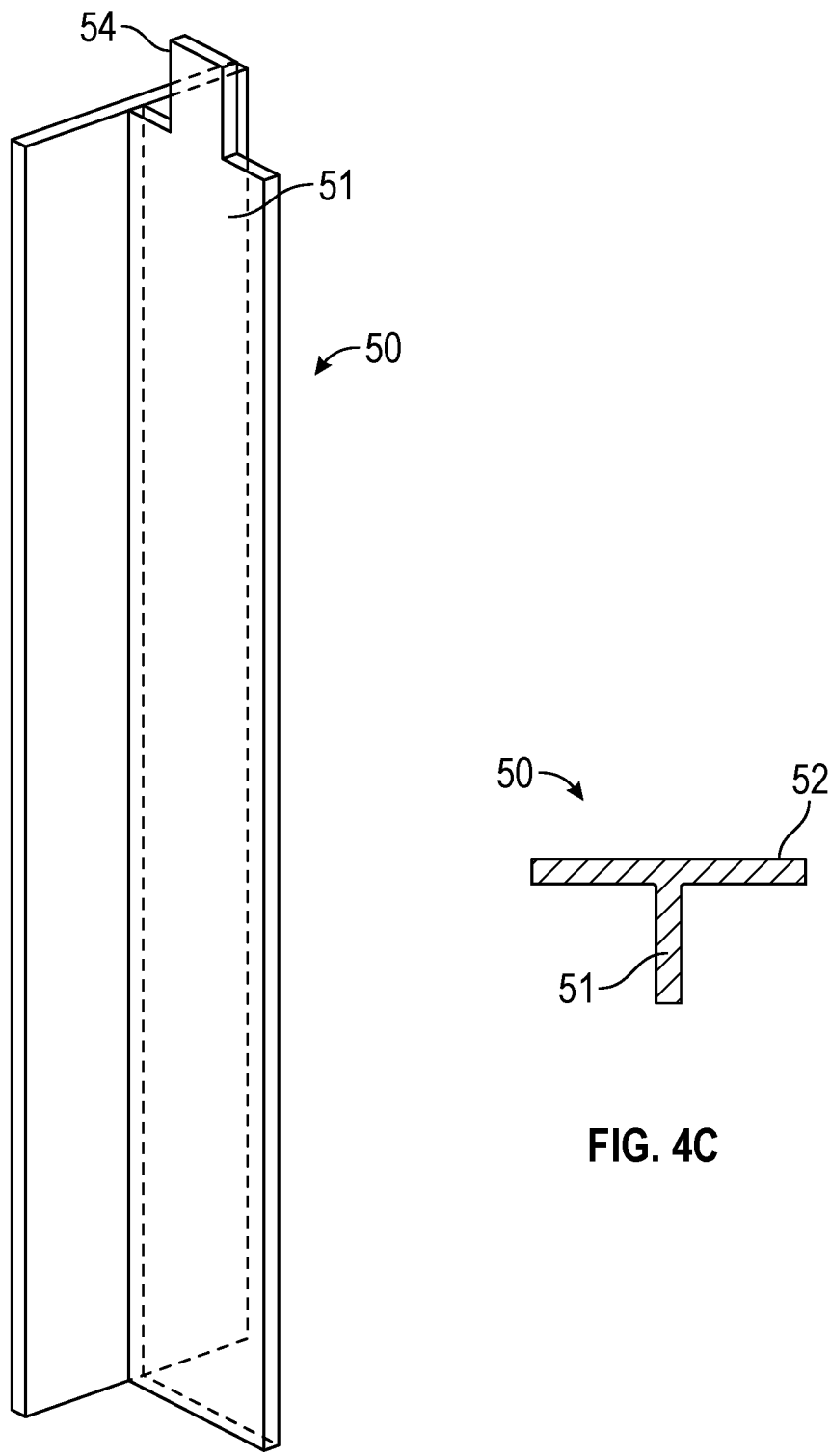
FIG. 4B is another isolated isometric view of the vertical bracket of FIG. 4A.
FIG. 4C is a cross section view of the vertical bracket of FIGS. 4A-4B taken along line 4C-4C in FIG. 4A.

FIGS. 4A-4C show views of one embodiment of the vertical bracket 50. Looking first at the vertical bracket 50 in FIG. 4A, it is shown that the vertical bracket has a show surface 52, which, when assembled to the rest of the server farm ventilation assembly, faces the interior, and has a flange 51 extending away from the show surface 52 and toward the exterior. The vertical bracket 50 further comprises a projection 54 at one end but may have a flat surface at an opposite end, as shown. Optionally, the opposite end of an adjacent vertical bracket above the horizontal bracket sits on the horizontal bracket when assembled (such as on the show surface, or on both the show surface and the flange, or just the flange). The projection cooperates with an opening 65 of an adjacent horizontal bracket 60 (discussed in further detail below), to help secure the air filters during assembly. That is, when assembled together, the projection 54 of the vertical bracket is further adapted to extend into the opening of an adjacent horizontal bracket immediately above the vertical bracket (with the only exception being the topmost vertical bracket where the projection would merely extend into the top channel 48). FIG. 4C shows the vertical bracket having a generally T-shaped cross section formed of the show surface 52 and flange 51. FIGS. 4A and 4B show an embodiment where a length of the show surface is about the same as a length of the flange. Optionally, these lengths can be varied with respect to one another as needed to accommodate other elements of the assembly.

Figure 5A:
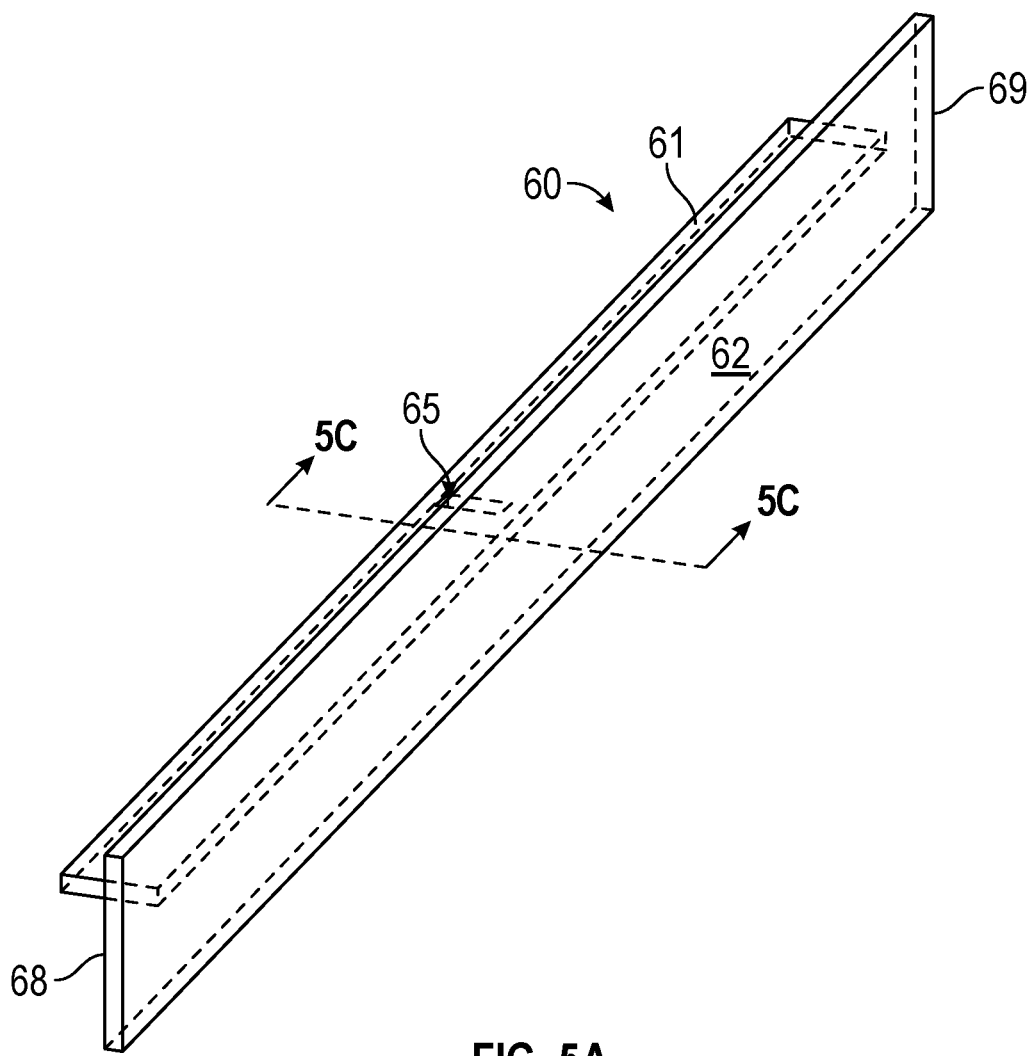
FIG. 5A is an isolated isometric view of a horizontal bracket used to help secure the air filters to the frame in accordance with one embodiment, showing a show surface.
Figure 5B:
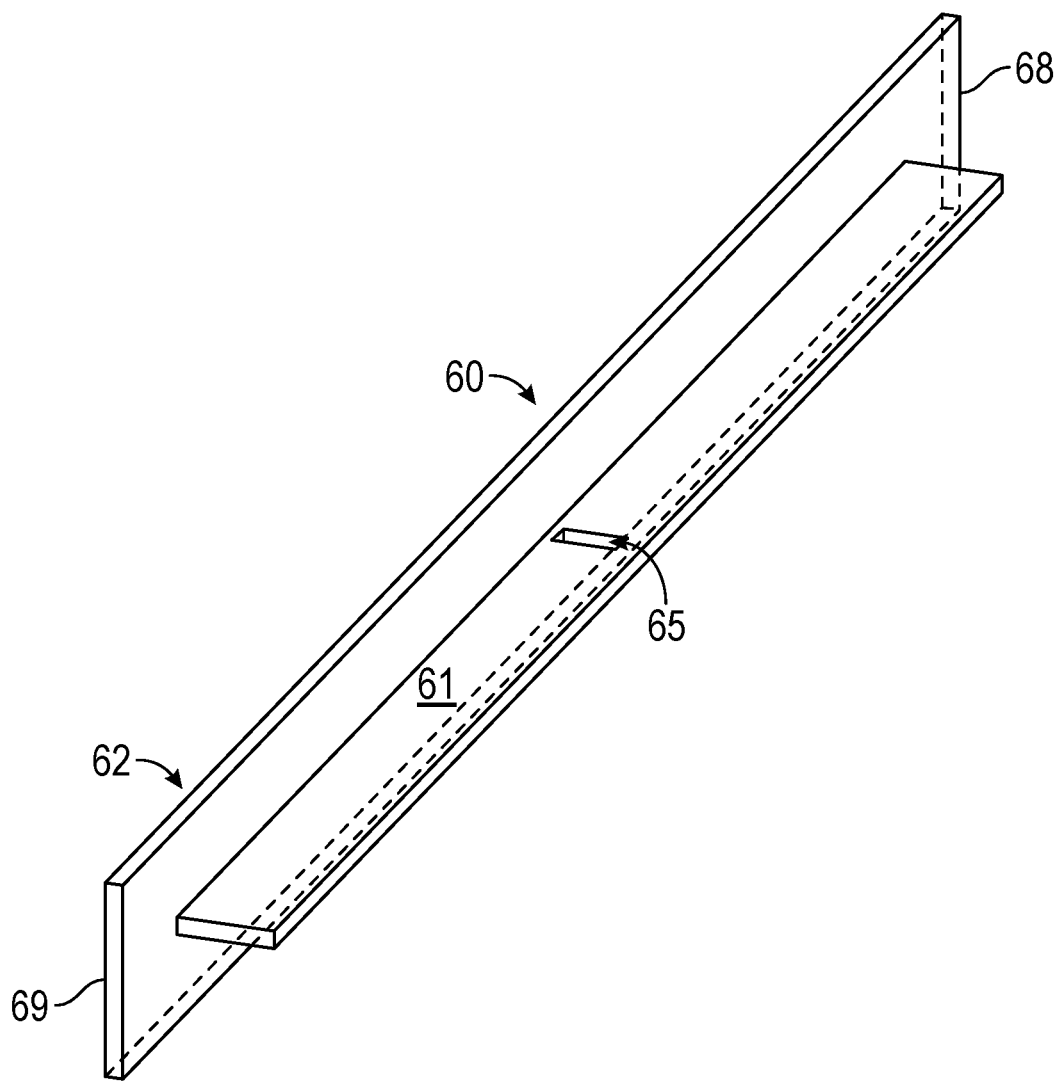
FIG. 5B is another isolated isometric view of the horizontal bracket of FIG. 5A.
Figure 5C:
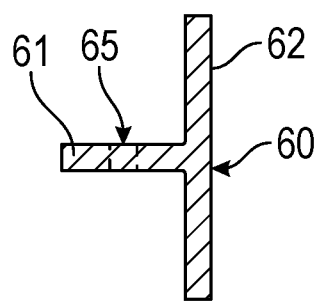
FIG. 5C is a cross section view of the horizontal bracket of FIGS. 5A-5B taken along line 5C-5C in FIG. 5A.

FIGS. 5A-5C show a horizontal bracket 60 which has a show surface 62 and a flange 61 extending away from the show surface and toward the exterior, and the flange 61 defines an opening 65. When assembled, the projection 54 of the vertical bracket below the horizontal bracket extends into or through the opening 65. The horizontal brackets may also be provided with slots at each end which makes the horizontal brackets a bit more flexible and therefore easier to assemble and disassemble. FIG. 5C shows the horizontal bracket having a generally T-shaped cross section formed of the show surface 62 and flange 61. FIGS. 5A and 5B show an embodiment where a length of the show surface is a little longer than a length of the flange (by extensions 68, 69). Optionally these lengths can be varied with respect to one another as needed to accommodate other elements of the assembly, such as the side walls of the frame.

Figure 6:
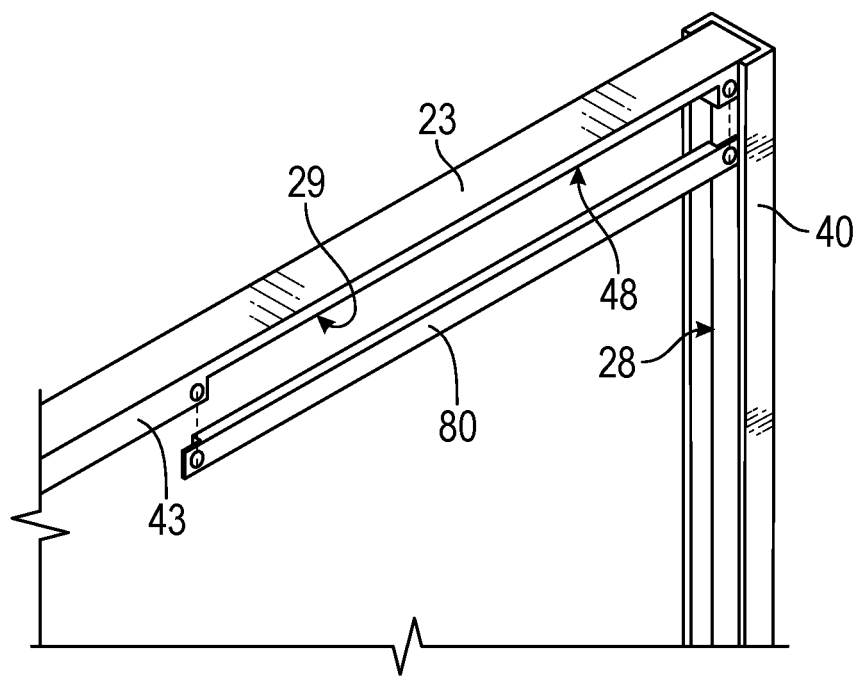
FIG. 6 is an exploded isometric view of a top bracket for closing a top opening in the frame in accordance with one embodiment.

FIG. 6 shows how the top bracket 80 cooperates with top wall 23 to close top opening 29. The top opening 29 has a width at least as large as the width of each air filter. This allows for ease of installation of air filters into the frame sequentially, with space for the last air filter to be installed. The top bracket 80 is shown adapted to be mounted to the top wall 23 and close the top opening. The top wall is also shown with a downward facing flange 43 which ends at the top opening (and also defines part of the top channel).

Figure 7:
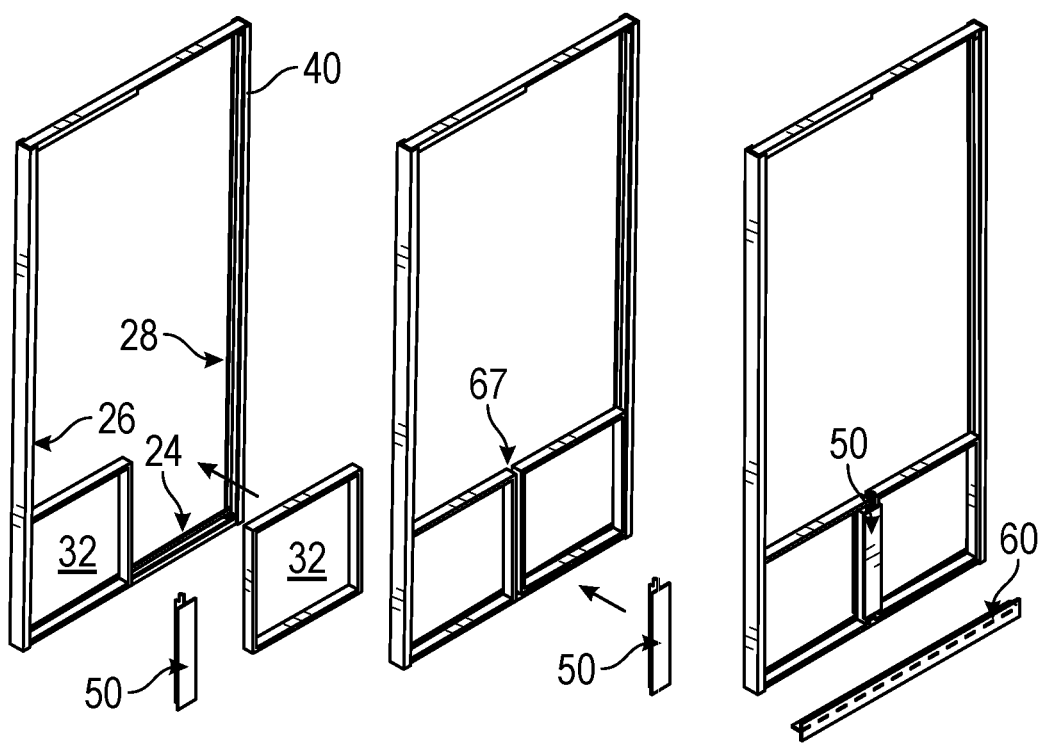
FIG. 7 is a side view showing the server farm ventilation assembly with air filters partially assembled.

FIG. 7 shows a series of images demonstrating assembly of the several air filters 32 into the frame 40 in accordance with an embodiment where six air filters are used to close the opening. A first air filter 32 is installed at the lower left in channels 24 and 26, then a second air filter adjacent the first air filter is installed in channels 24 and 28. There is a small gap 67 between the first air filter and the second air filter, and the flange 51 of the vertical bracket 50 extends into that gap to align the vertical bracket with respect to the air filters. Next, a horizontal bracket 60 can be attached, such that the projection 54 of the first vertical bracket extends at least into the opening 65. This acts to align the horizontal bracket with the vertical bracket and the air filters. From there the horizontal bracket may be attached to the side walls of the frame, securing the first row of air filters to the frame. The process can be repeated for each row.

Figure 8:
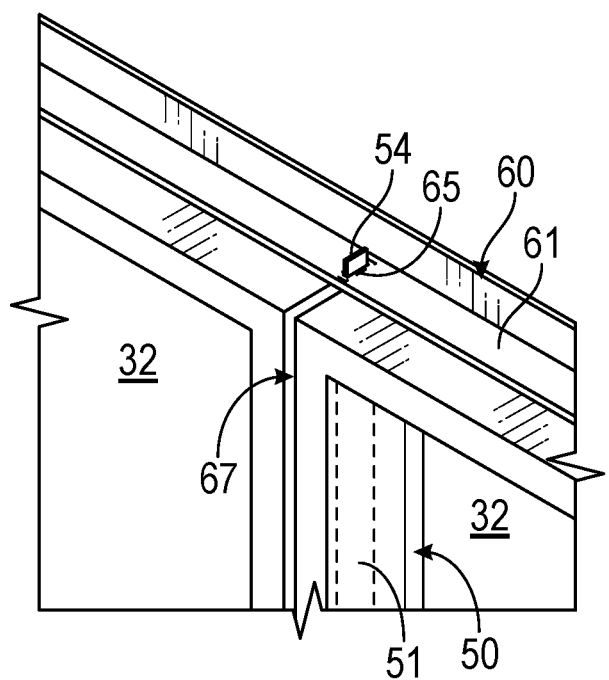
FIG. 8 is a partial isometric view showing the horizontal bracket and the vertical bracket cooperating to secure air filters in accordance with one embodiment.

FIG. 8 shows a close-up view looking toward the interior at the air filter subassembly. Flange 51 of a lower vertical bracket extends into gap 67 between the air filters. Also, in this embodiment the flange 51 has a length which is about the same as a length of the show surface. Thus, the lower vertical bracket flange 51 stops near an underside of the horizontal bracket 60 while projection 54 of that vertical bracket extends into opening 65 in the horizontal bracket 60. The projection may only extend into the opening or May extend above the opening, depending on the size and shape of the surrounding elements of the server fame ventilation assembly.

Figure 9:
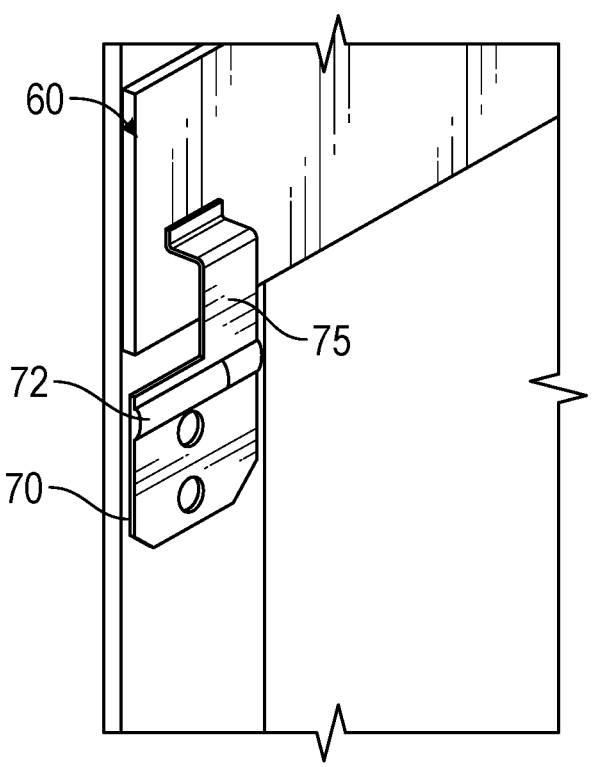
FIG. 9 is a close-up view of a mounting bracket adapted to secure the horizontal bracket to the frame.

FIG. 9 shows one embodiment for attaching the horizontal bracket(s) 60 to the frame. A first end of the embodiment of the horizontal bracket has a first fastener 70 adapted to secure the horizontal bracket 60 to the frame. The first fastener secures the horizontal bracket to the first side wall, and a second fastener secures the horizontal bracket to the second side wall. Each fastener 70 comprises a fastener hinge 72 and a fastener flange 75 along with openings for bolts or other similar attachment members to secure the fastener to the frame. The fastener hinge biases the fastener flange towards the horizontal bracket and helps to allow for ease of securing and removing the horizontal bracket to the frame. Optionally, slots extending through the middle of at least a part of the extensions of the horizontal bracket may be formed at the first end and the second end of the horizontal bracket. Such slots may allow the horizontal bracket to be resiliently deformable to aid in assembly and disassembly.

Unless otherwise defined, all technical and scientific terms used herein have the same meaning as commonly understood by one of ordinary skill in the art to which this invention belongs. Although methods and materials similar to or equivalent to those described herein can be used in the practice or testing of the various embodiments of the present disclosure, suitable methods and materials are described above. All patent applications, patents, and printed publications cited herein are incorporated herein by reference in their entireties, except for any definitions, subject matter disclaimers or disavowals, and except to the extent that the incorporated material is inconsistent with the express disclosure herein, in which case the language in this disclosure controls. The various embodiments of the present disclosure may be embodied in other specific forms without departing from the spirit or essential attributes thereof, and it is therefore desired that the various embodiments in the present disclosure be considered in all respects as illustrative and not restrictive. Any headings utilized within the description are for convenience only and have no legal or limiting effect.

What is claimed is:

1. A server farm ventilation assembly adapted to allow air to pass from an exterior of a building to an interior of the building, comprising:
 a frame having a plurality of walls that define an air filter opening, wherein the plurality of walls are comprised of a first side wall, a second side wall, a bottom wall and a top wall;
 a plurality of air filters each having a width, wherein the plurality of air filters are positioned to substantially close the air filter opening;
 a vertical bracket having a show surface facing the interior and a flange extending away from the show surface of the vertical bracket and toward the exterior, the vertical bracket further comprising a projection at one end;
 a horizontal bracket extending from the first side wall to the second side wall, having a show surface and a flange extending away from the show surface of the horizontal bracket and toward the exterior, with the flange includes an opening, and wherein the flange extends above an upper portion of a pair of horizontally adjacent air filters of the plurality of air filters; and
 a first fastener that secures the horizontal bracket to the first side wall and a second fastener that secures the horizontal bracket to the second side wall;
 wherein the flange of the vertical bracket is positioned in a vertical gap between the pair of horizontally adjacent air filters of the plurality of air filters, and the opening of the horizontal bracket receives the projection of the vertical bracket; and
 wherein the first fastener and the second fastener each comprise a fastener hinge and a fastener flange, wherein the fastener hinge biases the fastener flange towards the horizontal bracket.

2. The server farm ventilation assembly of claim 1, wherein an opposite end of the vertical bracket sits on the bottom wall of the frame.

3. The server farm ventilation assembly of claim 1, further comprising a louver subassembly comprising a series of louvers attached to the frame and positioned exterior of the plurality of air filters, wherein the server farm ventilation assembly is configured such that air flows from the exterior through the louvers and then to the plurality of air filters.

4. The server farm ventilation assembly of claim 1, wherein the show surface of the vertical bracket is aligned flush with the show surface of the horizontal bracket.

5. The server farm ventilation assembly of claim 1, wherein the plurality of air filters are organized in a plurality of rows, wherein each of the plurality of rows includes at least two air filters of the plurality of air filters.

6. The server farm ventilation assembly of claim 1, wherein the flange of the horizontal bracket has a length, and the show surface of the horizontal bracket has a length which is greater than the length of the flange of the horizontal bracket.

7. The server farm ventilation assembly of claim 1, wherein the top wall has a top opening having a width at least as large as the width of each air filter.

8. The server farm ventilation assembly of claim 7, further comprising a top bracket adapted to be mounted to the top wall of the frame and close the top opening.

9. The server farm ventilation assembly of claim 7, wherein the top wall has a downward facing flange which ends at the top opening.

10. The server farm ventilation assembly of claim 1, wherein the first side wall defines a first side channel adapted to receive a portion of at least one of the plurality of air filters, wherein the second side wall defines a second side channel adapted to receive a portion of at least one of the plurality of air filters, wherein the bottom wall defines a bottom channel adapted to receive a portion of at least one of the plurality of air filters, and wherein the top wall defines a top channel adapted to receive a portion of at least one of the plurality of air filters.

11. The server farm ventilation assembly of claim 1, wherein the frame is adapted to be attached to the building, and a louver subassembly is attached to the frame on the exterior from the plurality of air filters.

* * * * *